United States Patent
Wang et al.

(10) Patent No.: US 10,237,538 B2
(45) Date of Patent: Mar. 19, 2019

(54) DISPLAY PANEL, DRIVING METHOD THEREOF, MANUFACTURING METHOD THEREOF AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Yanfeng Wang, Beijing (CN); Xiaoling Xu, Beijing (CN); Yuanxin Du, Beijing (CN); Zhenhua Lv, Beijing (CN); Xiao Sun, Beijing (CN); Yun Qiu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 11 days.

(21) Appl. No.: 15/707,263

(22) Filed: Sep. 18, 2017

(65) Prior Publication Data
US 2018/0199026 A1    Jul. 12, 2018

(30) Foreign Application Priority Data
Jan. 11, 2017   (CN) .......................... 2017 1 0019491

(51) Int. Cl.
*G09G 3/32*   (2016.01)
*H04N 13/302*   (2018.01)
(Continued)

(52) U.S. Cl.
CPC ....... *H04N 13/302* (2018.05); *G02B 27/2214* (2013.01); *G09G 3/32* (2013.01);
(Continued)

(58) Field of Classification Search
CPC ...... G09G 3/3208; G09G 3/32; G09G 3/3233; G09G 3/3258
See application file for complete search history.

(56) References Cited

U.S. PATENT DOCUMENTS 9,880,442 B2 *   1/2018   Xu .......................... G02F 1/157
10,134,320 B2 *   11/2018   Wang ................... G09G 3/2003
(Continued)

FOREIGN PATENT DOCUMENTS

CN            1645219 A       7/2005
CN          102469327 A       5/2012
(Continued)

OTHER PUBLICATIONS evolife.cn; http://www.evolife.cn/html/2016/87527.html; "Sony's Crystal LED Display Technology is Finally Commercialized Four Years Later", May 20, 2016; 10 pages.
(Continued)

*Primary Examiner* — Vijay Shankar
(74) *Attorney, Agent, or Firm* — Ladas & Parry LLP (57) ABSTRACT

A display panel, a driving method thereof, a manufacturing method thereof and a display device. The display panel includes a first emission layer (EML) and a second EML. The first EML includes a plurality of first display pixel, the first display pixels each include at least one first luminescent unit; the second EML is disposed at a light-emitting side of the first display pixels and includes a plurality of second display pixels, the second display pixels each include at least one second luminescent unit, the second EML includes light-transmitting regions and light-shielding regions alternately arranged in a row direction; the first display pixels and orthographic projections of the second display pixels on the first EML are partially overlapped and the first display pixels are partially exposed from corresponding light-trans- (Continued)

mitting regions; and the first and second display pixels have a same light-emitting direction.

20 Claims, 6 Drawing Sheets (51) Int. Cl.
*H01L 27/32* (2006.01)
*G09G 3/3208* (2016.01)
*H01L 27/15* (2006.01)
*G02B 27/22* (2018.01)
*H04N 13/32* (2018.01)
*H04N 13/356* (2018.01)
*H04N 13/31* (2018.01)

(52) U.S. Cl.
CPC .......... *G09G 3/3208* (2013.01); *H01L 27/156* (2013.01); *H01L 27/32* (2013.01); *H04N 13/31* (2018.05); *H04N 13/32* (2018.05); *H04N 13/356* (2018.05); *H04N 2213/001* (2013.01)

(56) References Cited

U.S. PATENT DOCUMENTS

| | | | |
|---|---|---|---|
| 2012/0113159 A1 | 5/2012 | Chiba et al. | |
| 2016/0011428 A1* | 1/2016 | Li | G02B 27/2214 359/275 |
| 2016/0240117 A1* | 8/2016 | Xu | G09G 3/003 |
| 2016/0260371 A1 | 9/2016 | Wang et al. | |
| 2016/0329381 A1 | 11/2016 | Xu et al. | |

FOREIGN PATENT DOCUMENTS

| | | |
|---|---|---|
| CN | 103105680 A | 3/2013 |
| CN | 104297832 A | 1/2015 |
| CN | 104763950 A | 7/2015 |
| CN | 104765157 A | 7/2015 |
| CN | 104849869 A | 8/2015 |
| CN | 106125446 A | 11/2016 |

OTHER PUBLICATIONS feng.com; "The Latest Purchase will Bring Apple 21 Novel Technology Patents", 5 pages; May 4, 2014.
The First Chinese Office Action dated Feb. 1, 2018; Appln. No. 201710019491.8.

* cited by examiner

DISPLAY PANEL, DRIVING METHOD THEREOF, MANUFACTURING METHOD THEREOF AND DISPLAY DEVICE

TECHNICAL FIELD

Embodiments of the present disclosure relate to a display panel, a driving method thereof, a manufacturing method thereof and a display device.

BACKGROUND

In recent years, three-dimensional (3D) display technology has become a development trend in the display technology field. The basic principle of parallax-type 3D display technology is that: left and right eyes of a human receive different images with parallax (for example, the left eye and right eye of the human respectively receive a left-eye image and a right-eye image, and parallax is exist between the left-eye image and the right-eye image), and the different images with parallax are subjected to superposition via a brain to form 3D vision. The 3D display device mainly includes a glasses type and a glasses-free type. Because no glasses are required to wear, glasses-free type 3D display devices are attracting an increasing amount of attention. Because there is a limited number of 3D display videos/images currently, besides 3D display function, superior two-dimensional (2D) display function is also desired to be realized in the glasses-free type 3D display devices.

SUMMARY

An embodiment of the present disclosure provides a display panel, which comprises a first emission layer (EML) and a second EML; the first emission layer comprises a plurality of first display pixels arranged in an array, and the first display pixels each comprise at least one first luminescent unit; the second EML is disposed at a light-emitting side of the first display pixels of the first EML and comprises a plurality of second display pixels arranged in an array, and the second display pixels each comprise at least one second luminescent unit, the second EML comprises light-transmitting regions not provided with the second display pixels, and light-shielding regions provided with the second display pixels, and the light-transmitting regions and light-shielding regions are alternately arranged in a row direction; the first display pixels and orthographic projections of the second display pixels on the first emission layer are partially overlapped and the first display pixels are partially exposed from corresponding light-transmitting regions; and the first display pixels and the second display pixels have a same light-emitting direction.

For example, in the display panel provided by an embodiment of the present disclosure, the first luminescent unit and the second luminescent unit are inorganic light-emitting diodes (LEDs) or organic light-emitting diodes (OLEDs).

For example, in the display panel provided by an embodiment of the present disclosure, the first luminescent unit and the second luminescent unit are micro-LEDs.

For example, in the display panel provided by an embodiment of the present disclosure, a spacing D between the first EML and the second EML in the light-emitting direction, a width $W_w$ of each of the light-transmitting regions in the row direction, and a width $W_b$ of each of the light-shielding regions in the row direction satisfy following equations:

$$D = \frac{W_p L}{Q + W_p}, \quad W_w = \frac{Q W_p}{Q + W_p},$$

$W_b = (K-1)W_w$; $W_p$ is a width of each of the first display pixels in the row direction; L is an operating distance of the display panel; Q is a spacing between viewpoints of adjacent parallax images; K is a number of the parallax images displayed by the display panel; and the number K of the parallax images displayed by the display panel is an integer greater than or equal to 2.

For example, in the display panel provided by an embodiment of the present disclosure, further comprises a first substrate, the first substrate is disposed at a side of the first EML far away from the second EML, and is a transparent substrate or a semiconductor substrate.

For example, in the display panel provided by an embodiment of the present disclosure, further comprises a second substrate, the second substrate is disposed at a side of the second EML, closer to the first EML, and is a transparent substrate.

For example, in the display panel provided by an embodiment of the present disclosure, each of the second display pixels comprises K−1 second display sub-pixels.

For example, in the display panel provided by an embodiment of the present disclosure, further comprises a drive module, the drive module is configured to drive the first display pixels of the display panel to alternately display image-pixels corresponding to a first image and image-pixels corresponding to a second image in the row direction.

For example, in the display panel provided by an embodiment of the present disclosure, the drive module is further configured to allow the first image and the second image to respectively correspond to a left-eye image and a right-eye image.

For example, in the display panel provided by an embodiment of the present disclosure, the display panel comprises a two-dimensional (2D) display region and a three-dimensional (3D) display region; as for the 2D display region, the drive module is further configured to allow image-pixels, which are corresponding to the 2D display region, of the first image and image-pixels, which are corresponding to the 2D display region, of the second image to be the same; and as for the 3D display region, the drive module is further configured to allow image-pixels, which are corresponding to the 3D display region, of the first image and image-pixels, which are corresponding to the 3D display region, of the second image to respectively correspond to a left-eye image and a right-eye image, and to allow the second display pixels corresponding to the 3D display region to emit no light.

For example, in the display panel provided by an embodiment of the present disclosure, the drive module is further configured to drive the second display pixels of the display panel to display image-pixels corresponding to a third image; and the first image and the second image are same, and the third image is different from the first image and the second image.

An embodiment of the present disclosure further provides a method for driving the above-mentioned display panel, which comprises: driving the first display pixels of the display panel to alternately display image-pixels corresponding to a first image and image-pixels corresponding to a second image in the row direction.

For example, in the driving method provided by an embodiment of the present disclosure, the first image and the second image are same.

For example, in the driving method provided by an embodiment of the present disclosure, the first image and the second image respectively correspond to a left-eye image and a right-eye image.

For example, in the driving method provided by an embodiment of the present disclosure, the display panel comprising a 2D display region and a 3D display region, the driving method further comprising: driving the second display pixels corresponding to the 3D display region of the display panel to emit no light; wherein as for the 2D display region, image-pixels, which are corresponding to the 2D display region, of the first image and image-pixels, which are corresponding to the 2D display region, of the second image are same; and as for the 3D display region, image-pixels, which are corresponding to the 3D display region, of the first image and image-pixels, which are corresponding to the 3D display region, of the second image respectively correspond to a left-eye image and a right-eye image.

For example, in the driving method provided by an embodiment of the present disclosure, further comprises: driving the second display pixels of the display panel to display image-pixels corresponding to a third image; the third image is different from the first image and the second image.

Another embodiment of the present disclosure provides a display device, which comprises the above-mentioned display panel.

Further another embodiment of the present disclosure provides a method for manufacturing a display panel, which comprises forming a first emission layer (EML) and forming a second EML. The first EML comprises a plurality of first display pixels arranged in an array, and the first display pixels each comprise at least one first luminescent unit. The second EML is disposed at a light-emitting side of the first display pixels of the first EML, and comprises a plurality of second display pixels arranged in an array; the second display pixels each comprise at least one second luminescent unit. The second EML comprises light-transmitting regions not provided with the second display pixels and light-shielding regions provided with the second display pixels, and the light-transmitting regions and light-shielding regions are alternately arranged in a row direction; and the first display pixels and orthographic projections of the second display pixels on the first EML are partially overlapped and the first display pixels are partially exposed from corresponding light-transmitting regions; and the first display pixels and the second display pixels have a same light-emitting direction.

For example, in the manufacturing method provided by further another embodiment of the present disclosure, the first luminescent unit and the second luminescent unit are inorganic light-emitting diodes (LEDs) or organic light-emitting diodes (OLEDs).

For example, in the manufacturing method provided by further another embodiment of the present disclosure, a spacing D between the first EML and the second EML in the light-emitting direction, a width $W_w$ of each of the light-transmitting regions in the row direction, and a width $W_b$ of each of the light-shielding regions in the row direction satisfy following equations:

$$D = \frac{W_p L}{Q + W_p}; W_w = \frac{Q W_p}{Q + W_p};$$

$W_b = (K-1) W_w$; $W_p$ is a width of each of the first display pixels in the row direction; L is an operating distance of the display panel; Q is a spacing between viewpoints of adjacent parallax images; K is a number of the parallax images displayed by the display panel; and the number K of the parallax images displayed by the display panel is an integer greater than or equal to 2.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

FIG. 1(*a*) is a schematic plan view of a display panel provided by an embodiment of the present disclosure;

FIG. 1(*b*) is a schematic sectional view of the display panel illustrated in FIG. 1(*a*);

FIG. 1(*c*) is an exemplary schematic structural view of a luminescent unit in an embodiment of the present disclosure;

FIG. 3(*a*) is an exemplary diagram of a 2D display driving method of the display panel, provided by an embodiment of the present disclosure;

FIG. 3(*b*) is an exemplary diagram of another 2D display driving method of the display panel, provided by an embodiment of the present disclosure;

FIG. 3(*c*) is an exemplary diagram to illustrate an optical path of the display panel in the 2D display driving method illustrated in FIG. 3(*b*);

FIG. 3(*d*) is an exemplary diagram to illustrate an optical path of a first display pixel in an embodiment of the present disclosure;

FIG. 5(*a*) is an exemplary diagram to illustrate a driving method to realize 3D display function in partial region of the display panel, provided by an embodiment of the present disclosure;

FIG. 5(*b*) is an exemplary diagram to illustrate another driving method to realize 3D display function in partial region of the display panel, provided by an embodiment of the present disclosure;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," and the like, which are used in the description and the claims of the present application for disclosure, are not intended to indicate any sequence, amount or importance, but distinguish various components. Also, the terms such as "a," "an," and etc., are not intended to limit the amount, but indicate the existence of at least one. The terms "comprise," "comprising," "include," "including," and the like, are intended to specify that the elements or the objects stated before these terms encompass the elements or the objects and equivalents thereof listed after these terms, but do not preclude the other elements or objects. The phrases "connect", "connected", and the like, are not intended to define a physical connection or mechanical connection, but can include an electrical connection, directly or indirectly. "On," "under," "right," "left" and the like are only used to indicate relative position relationship, and when the position of the object which is described is changed, the relative position relationship may be changed accordingly.

The inventors have noticed that: for the current parallax barrier type 3D display device, a spacing D' between a 2D display panel and a parallax barrier in a light-emitting direction satisfy a following equation:

$$D' = \frac{W_p' L'}{Q + W_p'}.$$

In the above-mentioned equation, $W_p'$ refers to a width of a display pixel of the 2D display panel in a row direction, for example, the row direction is a direction parallel to an imaginary straight line connecting a left eye and a right eye of a human; L' refers to an operating distance of the display device (for example, for a mobile phone, the operating distance can be set to be 30 cm; for another example, for a 50-inch display screen, the operating distance can be set to be 300 cm); and Q refers to a spacing between viewpoints of adjacent parallax images. For example, the spacing between the viewpoints of the adjacent parallax images can be set to be Q=E/N, in which E refers to an interpupillary distance of a human (for example, 65 mm), and N is a natural number (for example, N can be set to be 1).

Therefore, in a case that the spacing Q between the viewpoints of the adjacent parallax images and the width $W_p'$ of the display pixel of the 2D display panel in the row direction are fixed, the spacing D' between the 2D display panel and the parallax barrier in the light-emitting direction is increased along with an increase of the operating distance L' of the display device, and thus a thickness of the display device can be increased. That is to say, the thickness of the display device is increased along with an increase of a size of the display panel. In addition, in a case of reduced value of the spacing Q between the viewpoints of the adjacent parallax images (for example, the value of N is increased), the spacing D' between the 2D display panel and the parallax barrier in the light-emitting direction can be further increased and thus the thickness of the display device can be further increased. For example, in a case of fixed values of Q and $W_p'$, the spacing D' between the 2D display panel and the parallax barrier in the light-emitting direction, in a 50-inch display screen, is about 10 times of that of a mobile phone, so the thickness of the 50-inch display screen can be greatly increased.

The inventors have further noted that: for the current parallax barrier type 3D display device, a width $W_w'$ of a light-transmitting region of the parallax barrier in the row direction, a width $W_b'$ of a light-shielding region of the parallax barrier in the row direction, and a number K of parallax images displayed by the display device satisfy the following formula:

$$W_b' = (K-1) W_w'.$$

In the above-mentioned equation, the parallax image displayed by the display device refers to images used for forming a 3D image, and the number K can be set to be an integer greater than or equal to 2. In the case of K=2, the user can only view the 3D image, for example, in front of a screen of the 3D device, so the viewing angle and the viewing range are limited. In a case that the value of K is increased, the user can view the 3D image for example, within a certain range deviated from the screen. Thus, the viewing angle and the viewing range of 3D display device can be improved by increasing the number K of the parallax images displayed by the display device.

However, in the case that the number K of the parallax images displayed by the display device is increased, even when the width $W_w'$ of the light-transmitting region of the parallax barrier in the row direction is reduced, the width $W_b'$ of the light-shielding region of the parallax barrier in the row direction can also be increased. For example, in a case that the number of the parallax images satisfies K=8, $W_b'$ and $W_w'$ satisfy the equation that $W_b'=7 W_w'$, namely the width $W_b'$ of the light-shielding region of the parallax barrier in the row direction is 7 times of the width $W_w'$ of the light-transmitting region of the parallax barrier in the row direction. Therefore, a large amount of light from the 2D display panel is shielded by the parallax barrier, so the brightness of the current parallax barrier type 3D display device can be greatly reduced.

For example, the width $W_b'$ of the light-shielding region of the parallax barrier in the row direction can be set to be K−1 times of the width $W_w'$ of the light-transmitting region of the parallax barrier in the row direction, and every K columns of pixels of the 2D display panel can correspond to K columns of image-pixels obtained from K parallax images (for example, each parallax image of the K parallax images provides one columns of image-pixels), so that the display device can display the K parallax images. For example, the concrete principle of displaying K parallax images by the parallax barrier type 3D display device can refer to the conventional multi-viewpoint 3D display technology. No further description will be given herein.

In addition, because the resolution of the current parallax barrier type 3D display device is equal to 1/K of the resolution of the 2D display panel, in the case that the number K of the parallax images displayed by the display device is increased, the resolution of the parallax barrier type 3D display device (particularly the resolution of the display device when switched to the 2D display mode) is accordingly reduced.

Parameters such as the thickness, the resolution and the brightness of the display device are key parameters of the display device, but the current parallax barrier type 3D display device has technical problems in the aspect of thickness, resolution, brightness, or the like. Therefore, the current parallax barrier type 3D display device is not satisfies the requirements and the expectations of the consumers on electronic products, especially on consumer electronic products.

Embodiments of the present disclosure provide a display panel, a manufacturing method thereof, a driving method thereof and a display device. The embodiments of the present disclosure adopt double-layer emission layers, and thus both 2D display function and 3D display function are achieved in a same display panel, the thicknesses of the display panel and the display device are reduced, and the brightness and the resolution in the 2D display mode and the controllability in the 3D display mode are increased.

At least one embodiment of the present disclosure provides a display panel. The display panel comprises a first emission layer (EML) and a second EML. The first emission layer comprises a plurality of first display pixels arranged in an array, and each of the first display pixels comprises at least one first luminescent unit; the second EML is disposed at a light-emitting side of the first display pixels of the first EML and comprises a plurality of second display pixels arranged in an array, and each of the second display pixels comprises at least one second luminescent unit, the second EML comprises light-transmitting regions not provided with the second display pixels, and light-shielding regions provided with the second display pixels, and the light-transmitting regions and light-shielding regions are alternately arranged in a row direction; the first display pixels and orthographic projections of the second display pixels on the first emission layer are partially overlapped and the first display pixels are partially exposed from corresponding light-transmitting regions; and the first display pixels and the second display pixels have a same light-emitting direction.

Figure 1A:
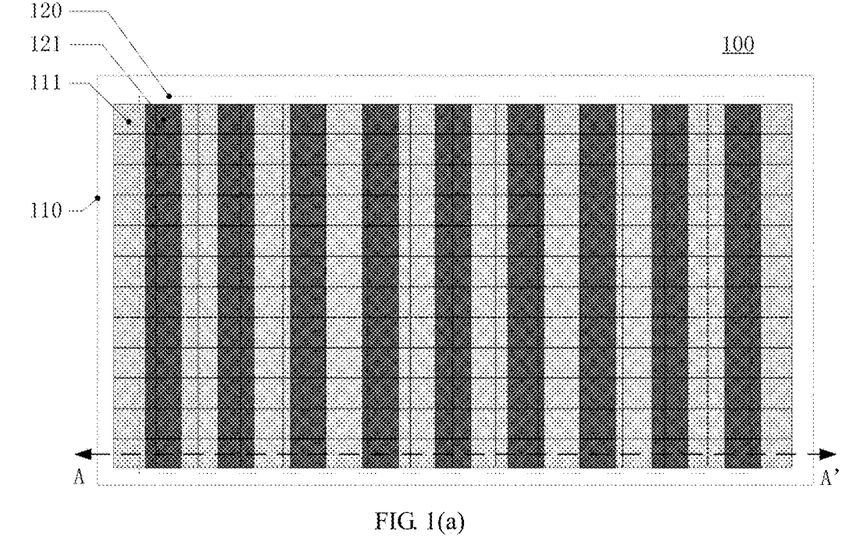
Figure 1B:
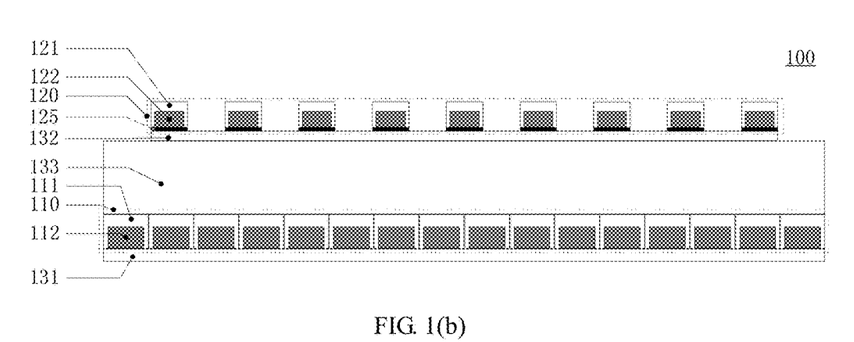

For example, FIGS. 1(a) and 1(b) are respectively a schematic plan view and a schematic sectional view of a display panel 100 provided by an embodiment of the present disclosure. The schematic sectional view illustrated in FIG. 1(b) is obtained by sectioning along an A-A' line illustrated in FIG. 1(a).

For example, as illustrated in FIGS. 1(a) and 1(b), the display panel 100 comprises a first EML 110 and a second EML 120. The first EML 110 includes a plurality of first display pixels 111 arranged in an array; each of the first display pixels 111 includes at least one first luminescent unit 112. The second EML 120 is disposed at a light-emitting side of the first display pixels 111 of the first EML 110, and includes a plurality of second display pixels 121 arranged in an array; each of the second display pixels 121 includes at least one second luminescent unit 122. The second EML comprises light-transmitting regions not provided with the second display pixels 121 and light-shielding regions provided with the second display pixels 121, and the light-transmitting regions and light-shielding regions are alternately arranged in the row direction. The first display pixels 111 and orthographic projections of the second display pixels 121 on the first EML 110 are partially overlapped and the first display pixels are partially exposed from corresponding light-transmitting regions. The first display pixels 111 and the second display pixels 121 have a same light-emitting direction; for example, the light-emitting direction of the first display pixels 111 and the second display pixels 121 can be a direction from the first display pixel 111 to the second display pixel 121.

For example, according to actual application demands, luminescent units (namely the first luminescent units 112 and the second luminescent units 122) can be inorganic light-emitting diodes (inorganic LEDs, for example, micro-LEDs) or organic light-emitting diodes (OLEDs, for example, micro-OLEDs). For example, a size of the luminescent unit can be set according to actual demands and manufacturing technology. For example, the size of the luminescent unit can be 5-50 μm.

Figure 1C:
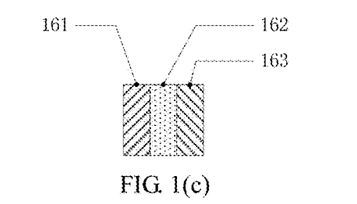

For example, a color of light emitted by the luminescent unit can be set according to actual application demands, no specific limitation will be given to the color of the light in the embodiment of the present disclosure. For example, the luminescent unit can emit monochromatic light. For another example, the luminescent unit can also emit polychromatic light formed by light of multiple colors. For example, in a case that the luminescent unit emits the monochromatic light, color display can be achieved by arranging a plurality of luminescent units with different luminous colors in the first display pixels 111 and/or the second display pixels 121. For example, in a case that the luminescent unit emits the polychromatic light formed by the light of multiple colors, the luminescent unit can be implemented as a structure illustrated in FIG. 1(c). The luminescent unit can include a first luminescent subunit 161, a second luminescent subunit 162 and a third luminescent subunit 163 arranged side by side (for example, the arrangement direction of the first luminescent subunit 161, the second luminescent subunit 162 and the third luminescent subunit 163 can parallel to a row direction or a column direction of the display panel as required). The colors of light emitted by the first luminescent subunit 161, the second luminescent subunit 162 and the third luminescent subunit 163 can be different from each other. For example, the colors of the light emitted by the first luminescent subunit 161, the second luminescent subunit 162 and the third luminescent subunit 163 can be respectively red, green and blue. It should be understood that the row direction of the display panel 100 can be a direction corresponding to (for example, parallel to) an imaginary straight line connecting a left eye and a right eye of a user in a case that the user is watching the display panel 100 in working state. It should be further understood that the column direction of the display panel 100 can be a direction perpendicular to the row direction.

For example, a width $W_p$ of the first display pixel 111 in the row direction (namely the direction parallel to the A-A' line) can be set according to actual application demands. For example, in a case that the width of the first luminescent unit 112 in the row direction is 10 μm, the width of the first display pixel 111 in the row direction can be 10-500 μm.

For example, according to actual application demands, the second display pixel 121 can include a plurality of second display sub-pixels arranged in the row direction (namely the direction parallel to the A-A' line). For example, each second display sub-pixel of the second display pixel 121 can be controlled independently. For example, in a case that a number of the parallax images displayed by the display panel 100 is set to be 4, the second display pixel 121 can include 3 second display sub-pixels arranged in the row direction. For another example, in a case that a number of the parallax images displayed by the display panel 100 is set to be 8, the second display pixel 121 can include 7 second display sub-pixels arranged in the row direction. For example, each second display sub-pixel can include 1 or 3 second luminescent units 122. For example, the arrangement methods of the second display pixels 121 in the column direction (namely the direction perpendicular to the A-A' line) is not limited to arrangement illustrated in FIG. 1(a) (that is, each second display pixel 121 is in direct contact with the second display pixels 121 adjacent in the column direction), a predetermined interval can be existed between adjacent second display pixels 121 in the column direction, no specific limitation will be given to the arrangement method of the second display pixels 121 in the column direction in the embodiment of the present disclosure.

For example, the display panel 100 can further comprise a shielding layer for shielding light from the first EML 110. The shielding layer can include a plurality of shielding units 125 arranged in an array; the plurality of shielding units 125 arranged in an array can be disposed at a side of the second EML 120 closer to the first EML 110; an orthographic projection of the shielding unit 125 and a corresponding second display pixel 121 on the first EML 110 are overlapped with each other; and the shielding unit 125 has a same size with the corresponding second display pixels 121. For example, the size and the material of the plurality of shielding units 125 can be set according to actual demands; no specific limitation will be given to the size and the material of the shielding units 125 in the embodiment of the present disclosure. For example, in a case that the width of the second luminescent unit 122 in the row direction is 10 μm, the width of the second display pixel 121 and the shielding unit 125 corresponding to the second display pixel in the row direction can be 10-500 μm. Thus, the width of the light-shielding region in the row direction is not limited to the width of the second luminescent unit 122 in the row direction, and thus can be adjusted. For example, the shielding unit 125 can be made from metal, light-absorbing materials, light-shielding materials with black color or other suitable materials.

Figure 2:
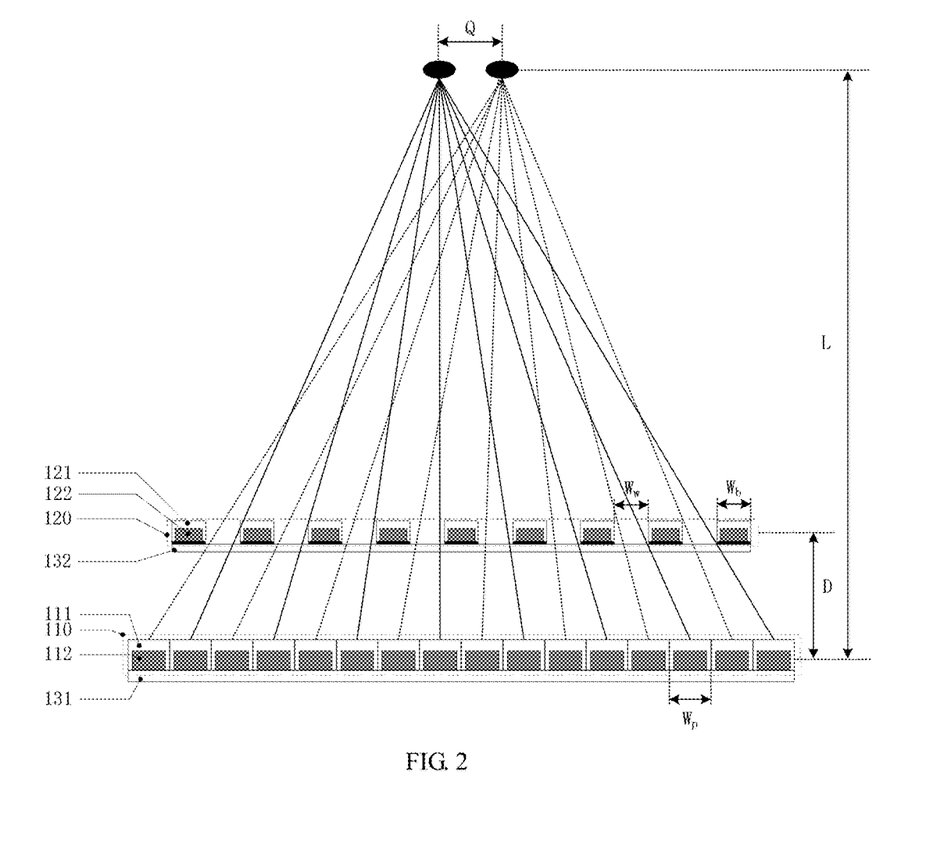
FIG. 2 is an exemplary diagram to illustrate an implementation method of the display panel provided by an embodiment of the present disclosure.

For example, FIG. 2 illustrates an illustrative implementation method of the display panel 100 provided by an embodiment of the present disclosure. Description will be given below to the implementation method of the first EML 110, the second EML 120, the first display pixels 111 and the second display pixels 121 with reference to FIG. 2.

For example, a spacing D between the first EML 110 and the second EML 120 in the light-emitting direction, a width $W_w$ of each of the light-transmitting regions in the row direction (namely a spacing between two adjacent second display pixels 121 in the row direction), and a width $W_b$ of each of the light-shielding regions in the row direction (namely a width of the second display pixel 121 in the row direction) can satisfy the following equations:

$$D = \frac{W_p L}{Q + W_p}, W_w = \frac{Q W_p}{Q + W_p}, W_b = (K-1)W_w, ,$$

$W_p$ refers to a width of each of the first display pixels 111 in the row direction; L refers to an operating distance of the display panel 100 (for example, for a hand-held mobile terminal such as a mobile phone, the operating distance can be set to be 30 cm; and for a 50-inch display screen, the operating distance can be set to be 300 cm, but the embodiment of the present disclosure is not limited thereto); Q refers to a spacing between viewpoints of adjacent parallax images, for example, the spacing between the viewpoints of the adjacent parallax images can be set to be Q=E/N, in which E refers to an interpupillary distance of a human (for example, 65 mm), and N is a natural number (for example, N can be set to be 1); and K refers to a number of the parallax images displayed by the display panel 100, and K can be set to be K=2M, in which M is a natural number (for example, M=1).

For example, in a case that K=2 and the above-mentioned formula is satisfied, as illustrated in FIG. 2, light emitted by the first display pixels 111 disposed in odd columns of the first EML 110 can be incident into the left eye of the user, and light emitted by the first display pixels 111 disposed in even columns of the first EML 110 can be incident into the right eye of the user. For example, the display panel 100 can achieve 2D display function in a case that image-pixels displayed by the first display pixels 111 disposed in the odd columns of the first EML 110 and image-pixels displayed by the first display pixels 111 disposed in the even columns of the first EML 110 are same (for example, the image pixel disposed in the odd columns of the first EML 110 and a corresponding image pixel disposed in the even columns of the first EML 110 have a same gray scale). For example, the display panel 100 can achieve 3D display function in a case that the image-pixels displayed by the first display pixels 111 disposed in the odd columns of the first EML 110 and the image-pixels displayed by the first display pixels 111 disposed in the even columns of the first EML 110 respectively correspond to left-eye image-pixels of a left-eye image and right-eye image-pixels of a right-eye image. Thus, the display panel 100 provided by an embodiment of the present disclosure can achieve both 2D display function and 3D display function in a same display panel.

For example, because the first luminescent units 112 of the display panel 100 provided by an embodiment of the present disclosure can adopt micro-LEDs or micro-OLEDs, the size of the first luminescent units can be 5-50 μm. Compared with the pixel size of hundreds of micrometers of the conventional display device, the size of the first luminescent unit (or the first display pixel) can be reduced by about 10-100 times. The spacing D between the first EML 110 and the second EML 120 in the light-emitting direction and the width $W_p$ of the first display pixel 111 in the row direction (for example, the width of the first luminescent unit 112 in the row direction) satisfy the following formula:

$$D = \frac{W_p L}{Q + W_p}.$$

In a case of fixed values of Q and L, the spacing D between the first EML 110 and the second EML 120 in the light-emitting direction can be reduced by about 10-100 times compare to the current parallax barrier type 3D display device. Thus, the thickness of the display panel 100 provided by an embodiment of the present disclosure and the display device comprising the display panel 100 can be reduced.

For example, the display panel 100 can further comprise a first substrate 131. The first substrate 131 can be disposed at a side of the first EML 110 far away from the second EML 120. For example, the first substrate 131 can be a transparent substrate or a semiconductor substrate. For example, in a case that the first substrate 131 is a transparent substrate, the first substrate 131 can be a glass substrate, a quartz substrate, a plastic substrate (for example, a polyethylene terephthalate (PET) substrate) or a substrate made from other suitable materials. For example, in a case that the first substrate 131 is a semiconductor substrate, the first substrate 131 can be a monocrystalline silicon (mono-Si), germanium or gallium arsenide substrate, preferably a mono-Si substrate.

For example, the display panel 100 can further comprise a second substrate 132. The second substrate 132 can be disposed at a side of the second EML 120 closer to the first EML 110. For example, the second substrate 132 can be a transparent substrate. For example, the second substrate 132 can be a glass substrate, a quart substrate, a plastic substrate (for example, a PET substrate) or a substrate made from other suitable materials.

For example, the display panel 100 can further comprise a transparent filler material 133. The transparent filler material 133 can be disposed between the first EML 110 and the second EML 120. For example, the transparent filler materials 133 can be used for realizing the immobilization of the first luminescent units 112 and/or the electric insulation between the first luminescent units 112 and/or the distance adjustment between the first EML and the second EML. For example, the transparent filler materials 133 can be made from inorganic or organic materials. For example, the transparent filler materials 133 can be made from organic resin, silicon oxide (SiOx), silicon oxynitride (SiNxOy), silicon nitride (SiNx), or the like, but the embodiment of the present disclosure is not limited thereto. Obviously, according to actual application demands, the transparent filler materials 133 can also be disposed at a side of the second EML 120 far away from the first EML 110, and are used for realizing the immobilization of the second luminescent units 122 and/or the electric insulation between the second luminescent units 122.

For example, in a case that the first substrate 131 is a transparent substrate, micro-LED units can be formed on a substrate (for example, a semiconductor substrate or a sapphire substrate) at first, and then the micro-LED units are transferred onto, for example, the transparent substrate (for example, a glass substrate) by suitable method (for example, transfer printing). Obviously, the micro-LED units can also be transferred onto the second substrate 132 by suitable method such as transfer printing. In other embodiments, the micro-LEDs can also be directly formed on the first substrate and/or the second substrate.

For example, in a case that the first substrate 131 is a semiconductor substrate, inorganic LED (for example, micro-LED) type luminescent elements can be formed on the semiconductor substrate by processes such as chemical vapor deposition (CVD), plasma enhanced chemical vapor deposition (PECVD) or physical vapor deposition (PVD).

For example, OLED type luminescent units (for example, micro-OLEDs) can be formed by the following steps: firstly, forming a drive array layer on a semiconductor substrate by semiconductor integrated circuit manufacturing process, in which the drive array layer includes a driver circuit (for example, including switching transistors, driving transistors, storage capacitors, or the like) for driving the luminescent units; secondly, forming a cathode layer on the drive array layer including the driver circuit, in which the cathode layer is, for example, electrically connected with source electrodes or drain electrodes of the driving transistors; thirdly, forming organic functional layers (for example, with evaporation method) on the cathode layer, for example, the organic functional layers can be one or more selected from an electron injection layer (EIL), an electron transport layer (ETL), an organic EML, a hole transport layer (HTL), and a hole injection layer (HIL); and fourthly, forming an anode layer (for example, a transparent electrode layer).

For example, the concrete position of the shielding unit 125 can be determined according to actual application demands, no specific limitation will be given here in the embodiment of the present disclosure. For example, the plurality of shielding units 125 arranged in an array can be disposed at a side of the second substrate 132 far away from the first substrate 131. For another example, the plurality of shielding units 125 arranged in an array can also be disposed at a side of the second substrate 132 closer to the first substrate 131. For example, a shielding layer film can be formed at first, and then the shielding units can be formed with the shielding layer film by photolithography.

For example, the display panel 100 can further comprise a drive module (which is not illustrated in figures). The drive module can drive the first display pixels and the second display pixels according to actual application demands. For example, the specific means of the drive module in driving the first display pixels and the second display pixels can refer to the following driving method of the display panel, provided by an embodiment of the present disclosure. No further description will be given herein.

For example, an embodiment of the present disclosure further provides a driving method of the display panel. The driving method of the display panel comprises: driving the first display pixels of the display panel to alternately display image-pixels corresponding to a first image and image-pixels corresponding to a second image in the row direction.

For example, positions of the image-pixels corresponding to the first image, disposed in the first image, are the same with positions of the image-pixels corresponding to the second image, disposed in the second image. For example, in a case that the image-pixel corresponding to the first image is disposed in the 3rd row and the 6th column of a pixel array of the first image, the image-pixel corresponding to the second image is disposed in the 3rd row and the 6th column of a pixel array of the second image.

Figure 3A:
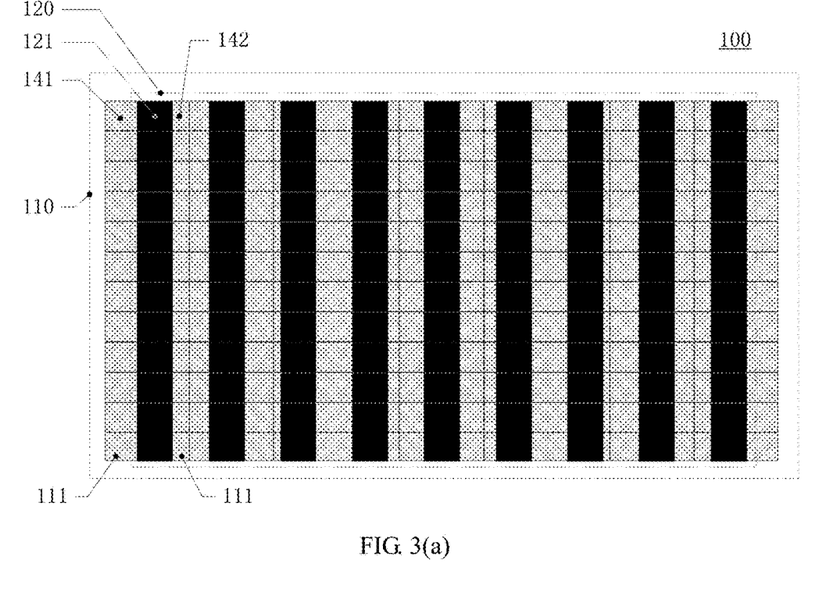

For example, FIG. 3(a) is an exemplary diagram of a 2D display driving method of the display panel 100 provided by an embodiment of the present disclosure. In the 2D display driving method illustrated in FIG. 3(a), the first display pixels 111 of the display panel 100 are driven to alternately display image-pixels 141 corresponding to the first image and image-pixels 142 corresponding to the second image in the row direction; the first image and the second image are same; and the second display pixels 121 do not emit light. In such a case, the optical path of the display panel 100 can refer to FIG. 2. That is to say, light emitted by the first display pixels 111 disposed in odd columns of the first EML 110 is incident into the left eye of the user, and light emitted by the first display pixels 111 disposed in even columns of the first EML 110 is incident into the right eye of the user. Because the first image and the second image are same, an image perceived by the user is a 2D image. In such a case, the resolution of the display panel 100 in the row direction is 1/K of the resolution of the first EML 110 in the row direction. Moreover, due to the shielding effect of the second display pixels 121, the brightness of the display panel can be also reduced.

Figure 3B:
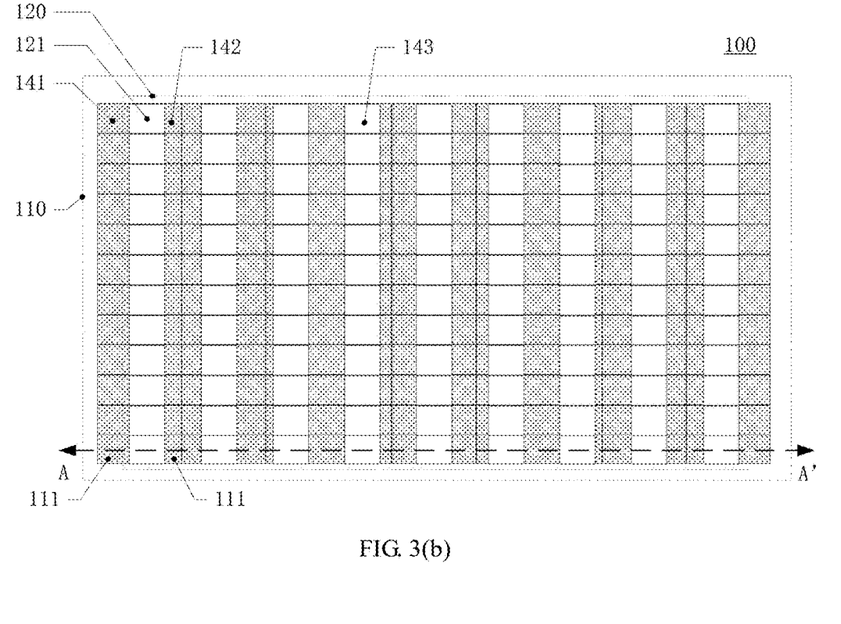
Figure 3C:
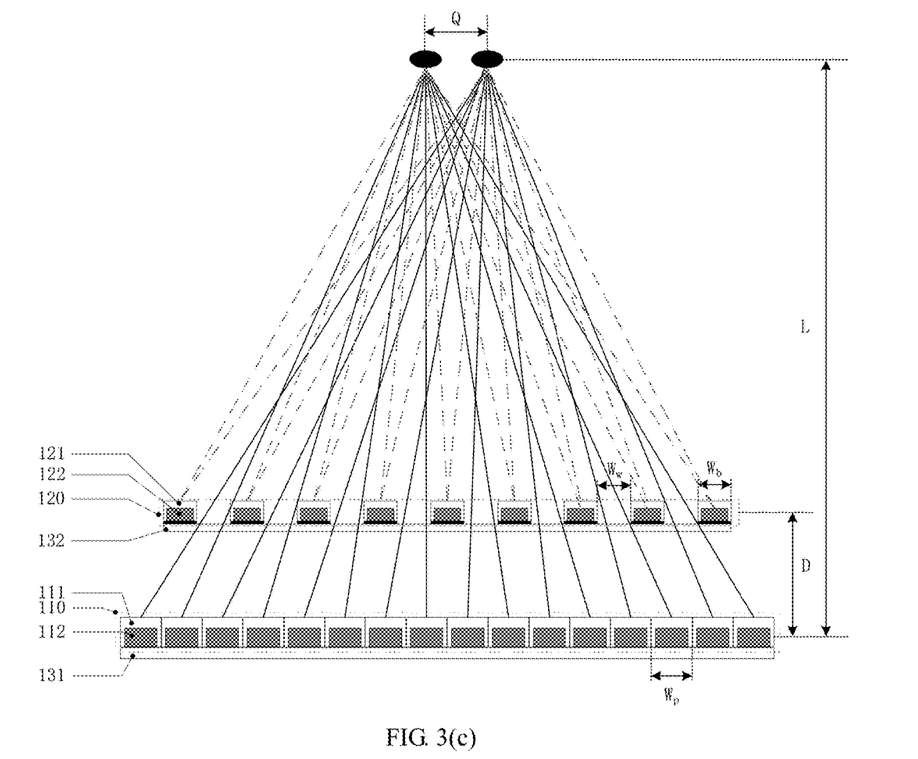
Figure 3D:
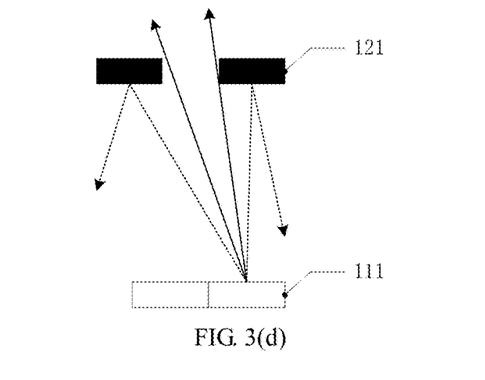

For example, FIG. 3(b) is an exemplary diagram of another 2D display driving method of the display panel provided by an embodiment of the present disclosure, and FIG. 3(c) illustrates an optical path of the display panel 100 in the 2D display driving method illustrated in FIG. 3(b). Compared with the 2D display driving method illustrated in FIG. 3(a), the 2D display driving method illustrated in FIGS. 3(b) and 3(c) further comprises: driving the second display pixels 121 to emit light. For example, the second display pixels 121 are driven to display image-pixels 143 corresponding to a third image; and the third image is different from the first image and the second image.

For example, position of the image-pixel 143 corresponding to the third image, disposed in the third image, is the same with the position of the image-pixel 141 corresponding to the first image, disposed in the first image, and the position of the image-pixel 142 corresponding to the second image, disposed in the second image. For example, in a case that the image-pixel 143 corresponding to the third image is disposed in the 3rd row and the 6th column of a pixel array of the third image, the image-pixel 141 corresponding to the first image is disposed in the 3rd row and the 6th column of the pixel array of the first image, and the image-pixel 142 corresponding to the second image is disposed in the 3rd row and the 6th column of the pixel array of the second image.

For example, as illustrated in FIG. 3(*c*), light emitted by the first display pixels 111 disposed in odd columns of the first EML 110 is incident into the left eye of the user; light emitted by the first display pixels 111 in even columns of the first EML 110 is incident into the right eye of the user; and light emitted by the second display pixels 121 disposed in the second EML 120 is incident into both of the left eye and the right eye of the user. Because the first image and the second image are same, an image perceived by the user is a 2D image. Because the third image is different from the first image and the second image, compared with the driving method illustrated in FIG. 3(*a*), the resolution and the brightness of the 2D image perceived by the user can be increased.

For example, in the 2D display driving method of the display panel 100 illustrated in FIGS. 3(*b*) and 3(*c*), because K is set to be 2, each of the second display pixels 121 only includes one second display sub-pixel, and each of the image-pixels 143 corresponding to the third image only includes one third image sub-pixel, but the embodiment of the present disclosure is not limited thereto. For example, according to actual application demands, each of the image-pixels 143 corresponding to the third image can also include a plurality of third image sub-pixels. For example, in a case that the number of the parallax images displayed by the display panel 100 is set to be 4, each of the image-pixels 143 corresponding to the third image can include 3 third image sub-pixels. For another example, in a case that the number of the parallax images displayed by the display panel 100 is set to be 8, each of the image-pixels 143 corresponding to the third image can include 7 third image sub-pixels. Thus, the resolution of the display panel 100 provided by an embodiment of the present disclosure in the 2D display driving mode illustrated in FIGS. 3(*b*) and 3(*c*) can be equal to the resolution of the first EMI, 110, and the brightness of the display panel 100 is also greatly increased.

For example, FIG. 3(*d*) is an exemplary diagram to illustrate an optical path of the first display pixel 111 in an embodiment of the present disclosure. As illustrated in FIG. 3(*d*), partial light emitted by the first display pixel 111 is shielded by the second display pixel 121 and cannot arrive at the user side, and light emitted by the second display pixel 121 is not shielded and can arrive at the user side. In the 2D display driving mode as illustrated in FIGS. 3(*b*) and 3(*c*), in order to ensure that the sum of the intensity of the light from the image-pixels 141 corresponding to the first image and the image-pixels 142 corresponding to the second image, arriving at the user side, is roughly equal to the intensity of the light from the image-pixels 143 corresponding to the third image, arriving at the user side, the first display pixel 111 and the corresponding second display pixel 121 can be driven with different drive current/voltage. For example, the drive current/voltage required by the first display pixels 111 and the second display pixels 121 can be determined by testing a brightness distribution arriving at the user side in advance, so that the sum of the intensity of the light from the image-pixels 141 corresponding to the first image and the image-pixels 142 corresponding to the second image, arriving at the user side, can be roughly equal to the intensity of the light from the image-pixels 143 corresponding to the third image, arriving at the user side.

Figure 4:
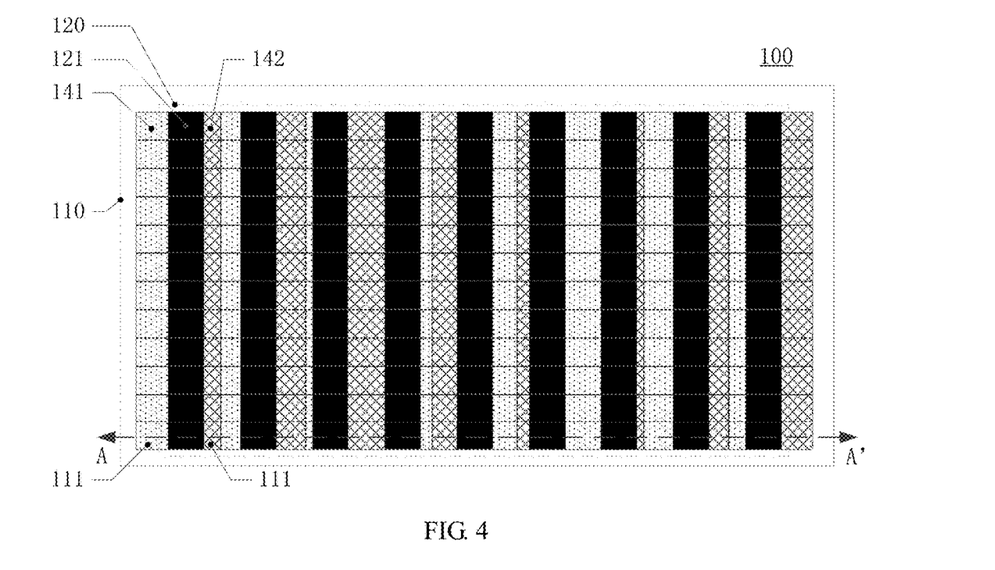
FIG. 4 is an exemplary diagram of a 3D display driving method of the display panel, provided by an embodiment of the present disclosure.

For example, FIG. 4 is an exemplary diagram of a 3D display driving method of the display panel 100 provided by an embodiment of the present disclosure. In the 3D display driving method illustrated in FIG. 4, the first display pixels 111 of the display panel 100 are driven to alternately display the image-pixels 141 corresponding to the first image and the image-pixels 142 corresponding to the second image in the row direction; the first image and the second image respectively correspond to a left-eye image and a right-eye image; and the second display pixels 121 do not emit light. In such a case, the optical path of the display panel 100 can refer to FIG. 2. That is to say, light emitted by the first display pixels 111 disposed in odd columns of the first EML 110 is incident into the left eye of the user, and light emitted by the first display pixels 111 disposed in even columns of the first EML 110 is incident into the right eye of the user. Because the first image and the second image respectively correspond to the left-eye image and the right-eye image, an image perceived by the user is a 3D image.

Figure 5A:
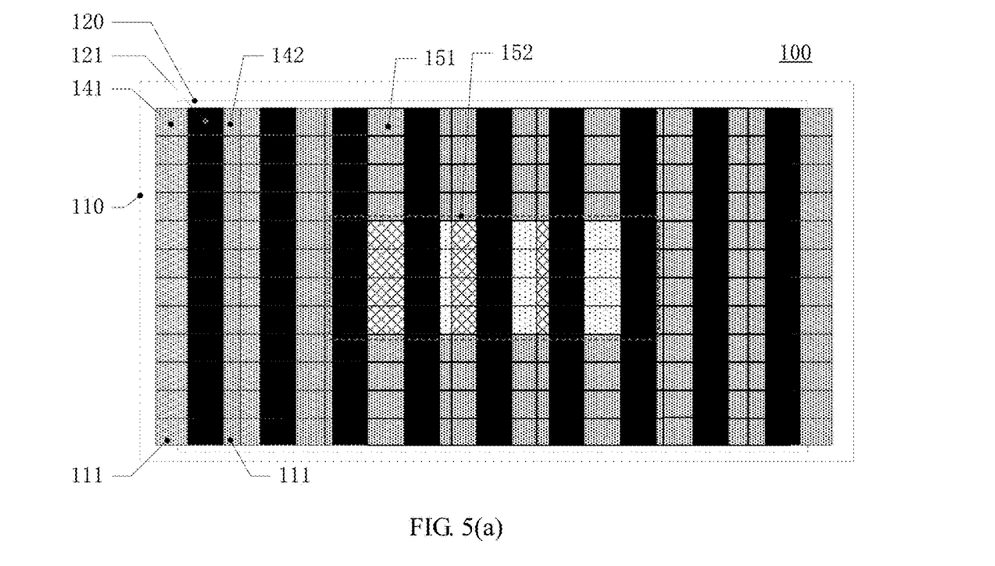

For example, FIG. 5(*a*) is an exemplary diagram to illustrate a driving method to realize 3D display function in partial region of the display panel 100 provided by an embodiment of the present disclosure. In the display driving method illustrated in FIG. 5(*a*), the display panel 100 can be divided into a 2D display region 151 and a 3D display region 152; as for the 2D display region 151, image-pixels, which are corresponding to the 2D display region, of the first image are the same with image-pixels, which are corresponding to the 2D display region, of the second image; and as for the 3D display region 152, image-pixels, which are corresponding to the 3D display region, of the first image and image-pixels, which are corresponding to the 3D display region, of the second image respectively correspond to a left-eye image and a right-eye image; and the second display pixels do not emit light. Thus, 3D display function can be achieved in partial region of the display panel 100. It should be noted that the 2D display region and the 3D display region herein can be divided in real time as required (namely the position and the area of the 2D display region and the 3D display region can be changed along with time), and real-time division can be realized by, for example, adoption of a control device (for example, a central processing unit (CPU)) to control image data inputted into the display panel. In such a case, the control device provided in the display panel or the control device provided at the outside of the display panel can send 2D image data and 3D image data respectively to the 2D display region and the 3D display region as required. It should be noted that the number of the 2D display region 151 and the number of the 3D display region 152 are not limited to the case (i.e., the display panel 100 comprises one 2D display region 151 and one 3D display region 152) illustrated in FIG. 5(*a*); for example, the number of the 2D display region 151 can also be two, and the number of the 3D display region 152 can also be four.

Figure 5B:
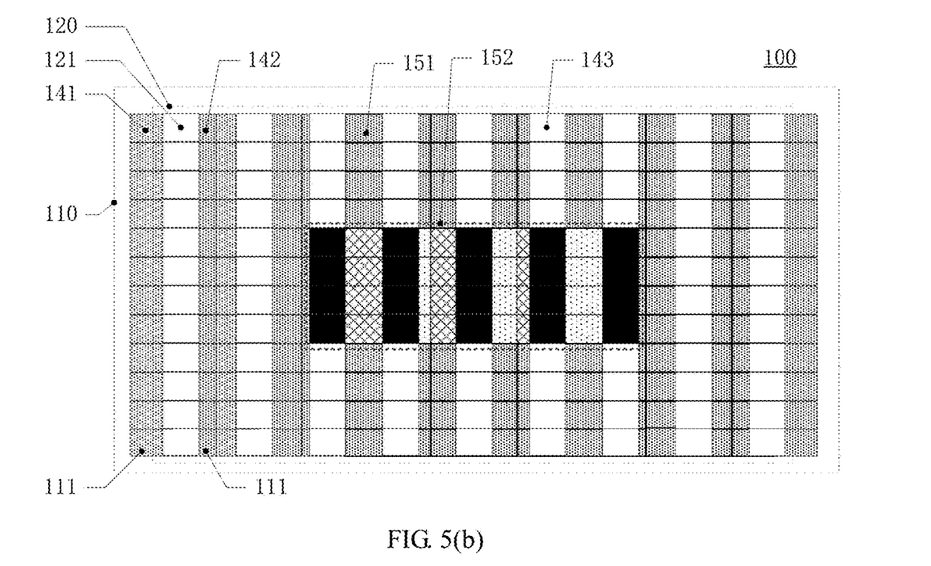

For example, FIG. 5(*b*) is an exemplary diagram of another driving method of the display panel 100 provided by an embodiment of the present disclosure. Compared with the driving method illustrated in FIG. 5(*a*), the driving method illustrated in FIG. 5(*b*) further comprises: driving the second display pixels 121 in the 2D display region 151 to display the image-pixels 143 corresponding to the third image. Moreover, the third image displayed by the second display pixels 121 in the 2D display region 151 is different from the first image and the second image displayed by the first display pixels 111 in the 2D display region 151. Thus, not only 3D display function can be achieved in partial region of the display panel 100 (i.e., the 3D display region 152) but also the resolution and the brightness in the 2D display region 151 can also be increased.

For example, in the display panel and the driving method provided by an embodiment of the present disclosure, the implementation method of the first EML 110, the second EML 120, the first display pixels 111 and the second display pixels 121, and the driving method of the display panel 100 are illustratively shown by taking the case that K=2 as an example, but the embodiment the present disclosure is not limited thereto. For example, according to actual application demands, the number K of the parallax images displayed by the display panel 100 can also be set to be 4, 6, 8, 10, 20, 100 or other values capable of satisfying the actual application demands, and the implementation method of the first EML 110, the second EML 120, the first display pixels 111 and the second display pixels 121, and the driving method of the display panel 100 can be adjusted accordingly.

Figure 6:
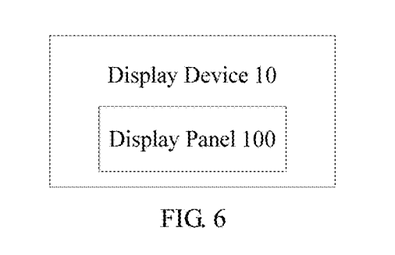
FIG. 6 is a block diagram of a display device provided by another embodiment of the present disclosure.

For example, FIG. 6 is a schematic diagram of a display device 10 provided by another embodiment of the present disclosure. The display device 10 comprises the display panel 100 provided by any embodiment of the present disclosure. It should be noted that: other necessary components (for example, a control device, an image data coding/decoding device, a gate driver, a source driver and a clock circuit) of the display device 10 can adopt conventional components, are not further described here, and shall not be constructed as the limitation of the embodiments of the present disclosure. For the display device 10 provided by an embodiment of the present disclosure, double-layer EMLs is adopted, and both 2D display and 3D display function are achieved in a same display device, the thickness of the display panel 100 and the display device 10 is reduced, and the brightness and the resolution in the 2D display mode and the controllability in the 3D display mode are increased.

For example, based on the same invention concept, at least one embodiment of the present disclosure further provides a manufacturing method of the display panel. The manufacturing method comprises forming a first EML and forming a second EML. The first EML comprises a plurality of first display pixels arranged in an array, and the first display pixels each comprise at least one first luminescent unit. The second EML is disposed at a light-emitting side of the first display pixels of the first EML, and comprises a plurality of second display pixels arranged in an array; the second display pixels each comprise at least one second luminescent unit; the second EMI, comprises light-transmitting regions not provided with the second display pixels and light-shielding regions provided with the second display pixels, and the light-transmitting regions and light-shielding regions are alternately arranged in a row direction. The first display pixels and orthographic projections of the second display pixels on the first EML are partially overlapped and the first display pixels are partially exposed from corresponding light-transmitting regions; and the first display pixels and the second display pixels have a same light-emitting direction.

Figure 7:
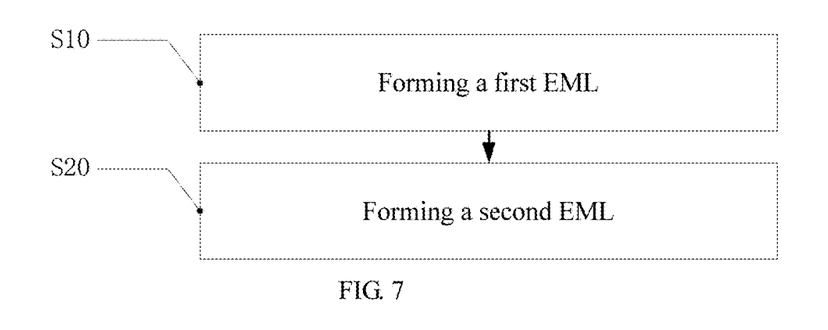
FIG. 7 is a flow diagram of a manufacturing method of a display panel, provided by further another embodiment of the present disclosure.

For example, FIG. 7 is a flow diagram of a manufacturing method of the display panel, provided by further another embodiment of the present disclosure. Taking the case illustrated in FIGS. 1(a) and 1(b) as an example, as illustrated in FIG. 7, the manufacturing method can comprise the following steps:

S10: forming a first EML; and
S20: forming a second EML.

For example, the first EML includes a plurality of first display pixels arranged in an array; each of the first display pixel includes at least one luminescent unit; the second EML is disposed at a light-emitting side of the first display pixels of the first EML, and includes a plurality of second display pixels arranged in an array; each of the second display pixel includes at least one luminescent unit; the second EML comprises light-transmitting regions not provided with the second display pixels and light-shielding regions provided with the second display pixels, and the light-transmitting regions and light-shielding regions are alternately arranged in a row direction; the first display pixels and orthographic projections of the second display pixels on the first EML are partially overlapped and the first display pixels are partially exposed from corresponding light-transmitting regions; and the first display pixels and the second display pixels have a same light-emitting direction.

For example, before the step of forming the first EML, the manufacturing method can further comprise: providing a first substrate. For example, before the step of forming the second EML, the manufacturing method can further comprise: providing a second substrate. For example, after the step of providing the second substrate and before the step of forming the second EML, the manufacturing method can further comprise: forming a shielding layer. The shielding layer can include a plurality of shielding units arranged in an array (for example, the plurality of shielding units can be formed by a patterning process), and thus the width of the second display pixel in the row direction can be adjusted. For example, the concrete implementation method of the first substrate, the second substrate and the shielding layer can refer to the embodiment of the display panel provided by the present disclosure. No further description will be given herein.

For example, according to actual application demands, the luminescent units (namely the first luminescent units and the second luminescent units) can be inorganic LEDs (for example, micro-LEDs) or OLEDs (for example, micro-OLEDs). For example, a size of the luminescent unit can be set according to actual demands and manufacturing technology. For example, the size of the luminescent unit can be 5-50 μm.

For example, the width $W_p$ of the first display pixel can be set according to actual application demands. For example, in a case that the width of the first luminescent unit in the row direction is 10 μM, the width of the first display pixel in the row direction can be 10-500 μm.

For example, according to actual application demands, the second display pixel can include a plurality of second display sub-pixels in the row direction (namely the direction parallel to the A-A' line). For example, in a case that the number of the parallax images displayed by the display panel is set to be 4, the second display pixel can include 3 second display sub-pixels in the row direction. Moreover, for example, in a case that the number of the parallax images displayed by the display panel is set to be 8, the second display pixel can include 7 second display sub-pixels in the row direction. For example, each second display sub-pixel can include 1 or 3 second luminescent units.

For example, a spacing D between the first EML and the second EML in the light-emitting direction, a width $W_w$ of each of the light-transmitting regions in the row direction, and a width $W_b$ of each of the light-shielding regions in the row direction satisfy the following equations:

$$D = \frac{W_p L}{Q + W_p}; W_w = \frac{Q W_p}{Q + W_p}; W_b = (K-1)W_w;$$

$W_p$ refers to a width of each of the first display pixels in the row direction; L refers to an operating distance of the display panel; Q refers to a spacing between viewpoints of adjacent parallax images; and K refers to a number of the parallax images displayed by the display panel.

For example, in a case that K=2 and the above formula is satisfied, as illustrated in FIG. 2, light emitted by the first display pixels disposed in odd columns of the first EML can be incident into the left eye of the user, and light emitted by the first display pixels disposed in even columns of the first EML can be incident into the right eye of the user. For example, the display panel can achieve 2D display function in a case that image-pixels displayed by the first display pixels disposed in the odd columns of the first EML and image-pixels displayed by the first display pixels disposed in the even columns of the first EML are same. For example, the display panel can achieve 3D display in a case that the image-pixels displayed by the first display pixels disposed in the odd columns of the first EML and the image-pixels displayed by the first display pixels disposed in the even columns of the first EML respectively correspond to left-eye image-pixels of a left-eye image and right-eye image-pixels of a right-eye image. Therefore, the display panel manufactured by the manufacturing method provided by further another embodiment of the present disclosure can achieve both 2D display function and 3D display function in a same display panel.

For example, the first luminescent units of the display panel provided by an embodiment of the present disclosure can adopt micro-LEDs or micro-OLEDs, and the size of the first luminescent units can be 5-50 μm, therefore, compared with the pixel size of hundreds of micrometers of the conventional display device, the size of the first luminescent unit can be reduced by about 10-100 times. The spacing D between the first EML and the second EML in the light-emitting direction and the width $W_p$ of the first display pixel 111 in the row direction (for example, the width of the first luminescent unit in the row direction) satisfy the following formula:

$$D = \frac{W_p L}{Q + W_p}.$$

In the case of fixed values of Q and L, the spacing D between the first EML and the second EML in the light-emitting direction can be reduced by about 10-100 times compare to the current parallax barrier type 3D display device. Thus, the thickness of the display panel, manufactured by the manufacturing method provided by further another embodiment of the present disclosure, and the display device comprising the display panel can be reduced.

For example, the manufacturing method of the display panel, provided by further another embodiment of the present disclosure, can further comprise: forming a drive module. The drive module can drive the first display pixels of the display panel to alternately display the image-pixels corresponding to the first image and the image-pixels corresponding to the second image in the row direction, and drive the second display pixels to display the image-pixels corresponding to the third image; the first image and the second image are same; and the third image is different from the first image and the second image. Thus, the resolution of the display panel in the 2D display mode can be equal to the resolution of the first EML, and the brightness of the display panel in the 2D display mode can also be increased.

For example, positions of the image-pixels corresponding to the first image, disposed in the first image, and positions of the image-pixels corresponding to second image, disposed in the second image, are the same with positions of the image-pixels corresponding to the third image, disposed in the third image. For example, in a case that the image-pixel corresponding to the first image is disposed in the 3rd row and the 6th column of a pixel array of the first image, the image-pixel corresponding to the second image is disposed in the 3rd row and the 6th column of a pixel array of the second image, and the image-pixel corresponding to the third image is disposed in the 3rd row and the 6th column of a pixel array of the third image.

For example, the drive module can drive the first display pixels of the display panel to alternately display the image-pixels corresponding to the first image and the image-pixels corresponding to the second image in the row direction; the first image and the second image respectively correspond to a left-eye image and a right-eye image; and the second display pixels do not emit light. Thus, 3D display function can be achieved.

For example, the drive module can also allow image-pixels corresponding to a 2D display region of the first image to be the same with image-pixels corresponding to the 2D display region, of the second image and allow image-pixels corresponding to a 3D display region of the first image and image-pixels corresponding to the 3D display region of the second image to respectively correspond to a left-eye image and a right-eye image. Thus, 3D display function in partial region of the display panel 100 can be achieved.

Embodiments of the present disclosure provide a display panel, a manufacturing method thereof, a driving method thereof and a display device. The embodiments of the present disclosure adopt double-layer EMLs, and thus both the 2D display function and 3D display function are achieved in a same display panel, the thickness of the display panel and the display device are reduced, and the brightness and the resolution in the 2D display mode and the controllability in the 3D display mode are increased.

What are described above is related to the illustrative embodiments of the disclosure only and not limitative to the scope of the disclosure; the scopes of the disclosure are defined by the accompanying claims.

The application claims priority to the Chinese patent application No. 201710019491.8, filed Jan. 11, 2017, the entire disclosure of which is incorporated herein by reference as part of the present application.

What is claimed is:

1. A driving method for driving a display panel,
the display panel comprising a first emission layer (EML) and a second EML,
the first EML comprising a plurality of first display pixels arranged in an array, and the first display pixels each comprising at least one first luminescent unit,
the second EML being disposed at a light-emitting side of the first display pixels of the first EML and comprising a plurality of second display pixels arranged in an array, and the second display pixels each comprising at least one second luminescent unit,
the second EML comprising light-transmitting regions not provided with the second display pixels and light-shielding regions provided with the second display pixels, and the light-transmitting regions and light-shielding regions being alternately arranged in a row direction,
the first display pixels and orthographic projections of the second display pixels on the first EML being partially overlapped and the first display pixels being partially exposed from corresponding light-transmitting regions, and the first display pixels and the second display pixels have a same light-emitting direction, the light-transmitting regions and the light-shielding regions, which are alternately arranged in the row direction, of the second EML being configured to allow the first display pixels of the first EML to form a plurality of parallax images in operation, the driving method comprising:

driving the first display pixels of the display panel to alternately display image-pixels corresponding to a first image and image-pixels corresponding to a second image in the row direction.

2. The driving method according to claim 1, wherein the first image and the second image are same.

3. The driving method according to claim 1, wherein the first image and the second image respectively correspond to a left-eye image and a right-eye image.

4. The driving method according to claim 1, the display panel comprising a 2D display region and a 3D display region, the driving method further comprising:

driving the second display pixels corresponding to the 3D display region of the display panel to emit no light; wherein as for the 2D display region, image-pixels, which are corresponding to the 2D display region, of the first image and image-pixels, which are corresponding to the 2D display region, of the second image are same; and as for the 3D display region, image-pixels, which are corresponding to the 3D display region, of the first image and image-pixels, which are corresponding to the 3D display region, of the second image respectively correspond to a left-eye image and a right-eye image.

5. The driving method according to claim 2, further comprising:

driving the second display pixels of the display panel to display image-pixels corresponding to a third image;

wherein the third image is different from the first image and the second image.

6. A display panel, comprising a first emission layer (EML) and a second EML; wherein the first EML comprises a plurality of first display pixels arranged in an array, and the first display pixels each comprise at least one first luminescent unit;

the second EML is disposed at a light-emitting side of the first display pixels of the first EML and comprises a plurality of second display pixels arranged in an array, and the second display pixels each comprise at least one second luminescent unit, the second EML comprises light-transmitting regions not provided with the second display pixels and light-shielding regions provided with the second display pixels, and the light-transmitting regions and light-shielding regions are alternately arranged in a row direction;

the first display pixels and orthographic projections of the second display pixels on the first EML are partially overlapped and the first display pixels are partially exposed from corresponding light-transmitting regions; and the first display pixels and the second display pixels have a same light-emitting direction; and the light-transmitting regions and the light-shielding regions, which are alternately arranged in the row direction, of the second EML are configured to allow the first display pixels of the first EML to form a plurality of parallax images in operation.

7. The display panel according to claim 6, wherein the first luminescent unit and the second luminescent unit are inorganic light-emitting diodes (LEDs) or organic light-emitting diodes (OLEDs).

8. The display panel according to claim 7, wherein the first luminescent unit and the second luminescent unit are micro-LEDs.

9. The display panel according to claim 6, wherein a spacing D between the first EML and the second EML in the light-emitting direction, a width $W_w$ of each of the light-transmitting regions in the row direction, and a width $W_b$ of each of the light-shielding regions in the row direction satisfy following equations:

$$D = \frac{W_p L}{Q + W_p}, W_w = \frac{Q W_p}{Q + W_p}, W_b = (K-1) W_w;$$

wherein, $W_p$ is a width of each of the first display pixels in the row direction; L is an operating distance of the display panel; Q is a spacing between viewpoints of adjacent parallax images; K is a number of the parallax images displayed by the display panel; and the number K of the parallax images displayed by the display panel is an integer greater than or equal to 2.

10. The display panel according to claim 6, further comprising a first substrate, wherein the first substrate is disposed at a side of the first EML far away from the second EML, and is a transparent substrate or a semiconductor substrate.

11. The display panel according to claim 6, further comprising a second substrate, wherein the second substrate is disposed at a side of the second EML closer to the first EML, and is a transparent substrate.

12. The display panel according to claim 9, wherein each of the second display pixels comprises K−1 second display sub-pixels.

13. The display panel according to claim 6, further comprising a drive module, wherein the drive module is configured to drive the first display pixels of the display panel to alternately display image-pixels corresponding to a first image and image-pixels corresponding to a second image in the row direction.

14. The display panel according to claim 13, wherein the drive module is further configured to allow the first image and the second image to respectively correspond to a left-eye image and a right-eye image.

15. The display panel according to claim 13, wherein the display panel comprises a two-dimensional (2D) display region and a three-dimensional (3D) display region;

as for the 2D display region, the drive module is further configured to allow image-pixels, which are corresponding to the 2D display region, of the first image and image-pixels, which are corresponding to the 2D display region, of the second image to be the same; and as for the 3D display region, the drive module is further configured to allow image-pixels, which are corresponding to the 3D display region, of the first image and image-pixels, which are corresponding to the 3D display region, of the second image to respectively correspond to a left-eye image and a right-eye image, and to allow the second display pixels corresponding to the 3D display region to emit no light.

16. The display panel according to claim 13, wherein
the drive module is further configured to drive the second display pixels of the display panel to display image-pixels corresponding to a third image; and
the first image and the second image are same, and the third image is different from the first image and the second image.

17. A display device, comprising the display panel according to claim 6.

18. A method for manufacturing a display panel, comprising:
forming a first emission layer (EML), wherein the first EML comprises a plurality of first display pixels arranged in an array, and the first display pixels each comprise at least one first luminescent unit; and
forming a second EML, wherein the second EML is disposed at a light-emitting side of the first display pixels of the first EML, and comprises a plurality of second display pixels arranged in an array; the second display pixels each comprise at least one second luminescent unit;
wherein the second EML comprises light-transmitting regions not provided with the second display pixels and light-shielding regions provided with the second display pixels, and the light-transmitting regions and light-shielding regions are alternately arranged in a row direction;
the first display pixels and orthographic projections of the second display pixels on the first EML are partially overlapped and the first display pixels are partially exposed from corresponding light-transmitting regions; and the first display pixels and the second display pixels have a same light-emitting direction; and
the light-transmitting regions and the light-shielding regions, which are alternately arranged in the row direction, of the second EML are configured to allow the first display pixels of the first EML to form a plurality of parallax images in operation.

19. The manufacturing method according to claim 18, wherein the first luminescent unit and the second luminescent unit are inorganic light-emitting diodes (LEDs) or organic light-emitting diodes (OLEDs).

20. The manufacturing method according to claim 18, wherein a spacing D between the first EML and the second EML in the light-emitting direction, a width $W_w$ of each of the light-transmitting regions in the row direction, and a width $W_b$ of each of the light-shielding regions in the row direction satisfy following equations:

$$D = \frac{W_p L}{Q + W_p}, \ W_w = \frac{Q W_p}{Q + W_p}, \ W_b = (K-1) W_w;$$

wherein, $W_p$ is a width of each of the first display pixels in the row direction; L is an operating distance of the display panel; Q is a spacing between viewpoints of adjacent parallax images; K is a number of the parallax images displayed by the display panel; and the number K of the parallax images displayed by the display panel is an integer greater than or equal to 2.

* * * * *